(12) United States Patent
Van Der Post et al.

(10) Patent No.: US 11,626,704 B2
(45) Date of Patent: Apr. 11, 2023

(54) METHODS AND APPARATUS FOR PREDICTING PERFORMANCE OF A MEASUREMENT METHOD, MEASUREMENT METHOD AND APPARATUS

(71) Applicant: ASML Netherlands B.V., Veldhoven (NL)

(72) Inventors: Sietse Thijmen Van Der Post, Utrecht (NL); Sander Bas Roobol, Veldhoven (NL); Pavel Evtushenko, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 746 days.

(21) Appl. No.: 15/902,454

(22) Filed: Feb. 22, 2018

(65) Prior Publication Data

US 2018/0254597 A1 Sep. 6, 2018

(30) Foreign Application Priority Data

Mar. 2, 2017 (EP) .................................... 17158942

(51) Int. Cl.
*H01S 3/0959* (2006.01)
*H01S 3/00* (2006.01)
(Continued)

(52) U.S. Cl.
CPC ........ *H01S 3/0959* (2013.01); *G03F 7/70033* (2013.01); *G03F 7/70641* (2013.01);
(Continued)

(58) Field of Classification Search
CPC .................................................. H01S 3/0092
See application file for complete search history.

(56) References Cited

U.S. PATENT DOCUMENTS 6,522,674 B1 * 2/2003 Niwano ................... H01S 3/225
372/29.01
6,711,183 B1 * 3/2004 Mizuuchi .............. G02F 1/3775
372/50.1
(Continued)

FOREIGN PATENT DOCUMENTS

CN 105229535 A 1/2016
EP 3296723 A1 3/2018
(Continued)

OTHER PUBLICATIONS

Shan, Bing, A. Cavalieri, and Zenghu Chang. "Tunable high harmonic generation with an optical parametric amplifier." Applied Physics B 74.1 (2002): s23-s26. (Year: 2002).*
(Continued)

*Primary Examiner* — Dominic J Bologna
(74) *Attorney, Agent, or Firm* — Sterne, Kessler, Goldstein & Fox P.L.L.C.

(57) ABSTRACT

A radiation source arrangement causes interaction between pump radiation (340) and a gaseous medium (406) to generate EUV or soft x-ray radiation by higher harmonic generation (HHG). The operating condition of the radiation source arrangement is monitored by detecting (420/430) third radiation (422) resulting from an interaction between condition sensing radiation and the medium. The condition sensing radiation (740) may be the same as the first radiation or it may be separately applied. The third radiation may be for example a portion of the condition sensing radiation that is reflected or scattered by a vacuum-gas boundary, or it may be lower harmonics of the HHG process, or fluorescence, or scattered. The sensor may include one or more image detectors so that spatial distribution of intensity and/or the angular distribution of the third radiation may be analyzed.

(Continued)

Feedback control based on the determined operating condition stabilizes operation of the HHG source.

21 Claims, 7 Drawing Sheets

(51) Int. Cl.
| | | |
|---|---|---|
| G03F 7/20 | (2006.01) | |
| H01S 3/109 | (2006.01) | |
| H01J 47/02 | (2006.01) | |
| H01S 3/0971 | (2006.01) | |
| H01L 21/263 | (2006.01) | |
| H05G 2/00 | (2006.01) | |

(52) U.S. Cl.
CPC ........ *G03F 7/70683* (2013.01); *H01J 47/026* (2013.01); *H01L 21/2636* (2013.01); *H01S 3/0085* (2013.01); *H01S 3/0092* (2013.01); *H01S 3/09716* (2013.01); *H01S 3/1095* (2013.01); *H05G 2/008* (2013.01); *H05G 2/003* (2013.01)

(56) References Cited

U.S. PATENT DOCUMENTS

| | | | |
|---|---|---|---|
| 8,264,683 B2* | 9/2012 | Matula | G01N 21/01 356/337 |
| 9,645,510 B2 | 5/2017 | Op 'T Root et al. | |
| 10,159,602 B2 | 12/2018 | Vogler et al. | |
| 2002/0186741 A1* | 12/2002 | Kleinschmidt | H01S 3/134 372/57 |
| 2005/0226287 A1* | 10/2005 | Shah | H01S 3/0057 372/25 |
| 2008/0069171 A1 | 3/2008 | Rocca et al. | |
| 2008/0144672 A1 | 6/2008 | Cohen et al. | |
| 2010/0192973 A1* | 8/2010 | Ueno | G02B 19/0052 134/1.1 |
| 2011/0001978 A1 | 1/2011 | Smilde et al. | |
| 2012/0019826 A1* | 1/2012 | Graham | G01B 11/26 356/400 |
| 2014/0111799 A1 | 4/2014 | Lei et al. | |
| 2014/0183362 A1* | 7/2014 | Islam | G01N 33/442 250/338.4 |
| 2015/0198860 A1 | 7/2015 | Chang et al. | |
| 2016/0061750 A1 | 3/2016 | Den Boef et al. | |
| 2016/0282282 A1 | 9/2016 | Quintanilha et al. | |
| 2017/0045823 A1 | 2/2017 | Quintanilha | |
| 2017/0184511 A1 | 6/2017 | Den Boef et al. | |

FOREIGN PATENT DOCUMENTS

| | | |
|---|---|---|
| EP | 3 321 739 A1 | 5/2018 |
| KR | 2016-0145662 A | 12/2016 |
| TW | 2015-02714 A | 1/2015 |
| WO | WO 2015/172963 A1 | 11/2015 |
| WO | WO 2017/025392 A1 | 2/2017 |
| WO | WO 2017/108404 A1 | 6/2017 |
| WO | WO 2017/108410 A1 | 6/2017 |

OTHER PUBLICATIONS

Peatross, J., and D. D. Meyerhofer. "Angular distribution of high-order harmonics emitted from rare gases at low density." Physical Review A 51.2 (1995): R906. (Year: 1995).*

International Preliminary Report on Patentability directed to related International Patent Application No. PCT/EP2018/053037, dated Sep. 3, 2019; 8 pages.

R.I. Rabady, "Simplified Model for Light Propagation in Graded-Index-Medium," Optics and Photonics Journal, vol. 3, Nov. 2013; pp. 347-350.

Hage et al., "New design of a multi-jet target for quasi phase matching," Review of Scientific Instruments, vol. 85, No. 10, Oct. 7, 2014; pp. 103105-1-103105-5.

Peatross et al., "Novel gas target for use in laser harmonic generation," Review of Scientific Instruments, vol. 64, No. 11, Nov. 1993; pp. 3066-3071.

"Near Infrared Camera C5840-10/-11," Hamamatsu Data Sheet, Hamamatsu Photonics K.K., 2002; 2 pages.

"High harmonic generation," Wikipedia article, last updated Feb. 24, 2017, accessed at https://en.wikipedia.org/wiki/High_harmonic_generation; 2 pages.

"Photoluminescence," Wikipedia article, last updated Feb. 22, 2017, accessed at https://en.wikipedia.org/wiki/Photoluminescence; 3 pages.

International Search Report and Written Opinion of the International Searching Authority directed to related International patent Application No. PCT/EP2018/053037, dated Apr. 30, 2018; 15 pages.

Chinese Office Action directed to related Chinese Patent Application No. 201880015450.4, dated Sep. 21, 2022; 25 pages.

* cited by examiner

METHODS AND APPARATUS FOR PREDICTING PERFORMANCE OF A MEASUREMENT METHOD, MEASUREMENT METHOD AND APPARATUS

CROSS REFERENCE TO RELATED APPLICATIONS

This application incorporates by reference in its entirety EP Patent Application No. 17158942, filed Mar. 2, 2017.

FIELD

The present disclosure relates to methods and apparatus for inspection (e.g., metrology) usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

At the same time, the known inspection techniques employ radiation in the visible or ultraviolet waveband. This limits the smallest features that can be measured, so that the technique can no longer measure directly the smallest features made in modern lithographic processes. To allow measurement of smaller structures, it has been proposed to use radiation of shorter wavelengths, similar for example to the extreme ultraviolet (EUV) wavelengths used in EUV lithography. Such wavelengths may be in the range 1 to 100 nm, for example, or 1-125 nm. Part or all of this wavelength range may also be referred to as soft x-ray (SXR) wavelengths. Some authors may use SXR to refer to a narrower range of wavelengths, for example in the range 1-10 nm or 1-20 nm. For the purposes of the present disclosure, these terms SXR and EUV will be used without implying any hard distinction. Metrology using harder x-rays, for example in the range 0.1-1 nm is also contemplated. Examples of transmissive and reflective metrology techniques using these wavelengths in transmissive and/or reflective scattering modes are disclosed in published patent application WO2015172963A1. Further examples of metrology techniques and apparatuses using these wavelengths in transmissive and/or reflective scattering modes are disclosed in the published patent applications US2016282282A1, US2017045823A1 and WO2017025392A1 and in the international patent application number PCT/EP2016/080058, not yet published at the present priority date. The contents of all these applications are incorporated herein by reference.

Convenient sources of SXR radiation include higher harmonic generation (HHG) sources, in which infrared pump radiation from a laser is converted to shorter wavelength radiation by interaction with a gaseous medium. HHG sources are available for example from KMLabs, Boulder Colo., USA (http://www.kmlabs.com/). Various modifications of HHG sources are also under consideration for application in inspection apparatus for lithography. Some of these modifications are disclosed for example in European patent application number 16198346.5 dated Nov. 11, 2016, not been published at the priority date of the present application. Other modifications are disclosed in U.S. patent application Ser. No. 15/388,463 and international patent application PCT/EP2016/080103, both claiming priority from European patent application no. 15202301.6 dated Dec. 23, 2015 also not yet been published at the priority date of the present application. European patent application no. 16188816.9 dated Sep. 14, 2016, not published at the present priority date, describes the correction of wavefronts in an HHG radiation source to minimize blurring of the measurement spot in an inspection apparatus. The contents of all of these applications are incorporated herein by reference.

Since the SXR photons of interest have a very short penetration depth in any medium, the gaseous medium may take the form of a gas jet located in a low-pressure (near vacuum) environment. The gas jet may be freely ejected from a nozzle, or confined within a waveguide structure that prolongs its interaction with the pump radiation. Whatever the detailed implementation, it may be expected that performance of the radiation source is sensitive to a number of parameters such as the position, shape and size of the pump radiation focus with respect to the gas jet, as well as the geometric shape, flowrate, pressure and stability of the gas jet itself. To create a high power, stable SXR output for use in high-volume manufacturing environments, it is desirable to provide a source that will be stable over time. Currently, most of the parameters mentioned above are adjusted by hand while evaluating the (wavelength dependent) intensity of the generated radiation. The known arrangements therefore do not provide automatic sensing of conditions within the HHG source, which would enable the provision of automatic feedback loops to stabilize and optimize the radiation output over a long period, perhaps measured in months or even years.

SUMMARY OF THE INVENTION

The invention aims to improve the monitoring and/or control of operating conditions in an HHG radiation source arrangement.

The present invention in a first aspect provides radiation source arrangement operable to cause an interaction between first radiation and a medium and thereby to generate second radiation by higher harmonic generation, the radiation source arrangement further comprising:

at least one sensor for detecting third radiation resulting from an interaction of the condition sensing radiation and the medium, the third radiation having a character different than the second radiation; and a processor for determining an operating condition of the radiation source arrangement based at least partly on the detected third radiation.

The character of the third radiation may be different in properties such as wavelength and/or direction. Benefit may be obtained in particular because the third radiation is traveling from the medium in a different direction (or directions) than the second radiation. The third radiation can thus be collected and detected without disrupting the precious second radiation that tis the main product of the radiation source arrangement.

In embodiments of the radiation source arrangement the second radiation comprises wavelengths shorter than 100 nm (optionally shorter than 20 nm or shorter than 10 nm), while the first radiation comprises wavelengths longer than 100 nm. In different embodiments, the third radiation may have a wavelength longer than 100 nm, or shorter than 100 nm.

The first radiation may serve also as the condition sensing radiation, or a separate type of radiation may be provided as the condition sensing radiation.

The determining of the operating condition can use third radiation that is available due to effects incidental to the HHG process. Said third radiation may for example include portions of the condition sensing radiation that are reflected or scattered by the HHG medium. In other embodiments, the third radiation includes radiation that is emitted due to interactions other than HHG. In other embodiments, the third radiation includes harmonics generated at lower wavelengths than the harmonics that are used in said second radiation.

The invention further provides an inspection apparatus comprising an illumination system for delivering inspection radiation to a target structure and a detection system for detecting said inspection radiation after interaction with the target structure, and wherein the illumination system includes a radiation source arrangement according to the first aspect of the invention as set forth above, the second radiation generated by higher harmonic generation being used as said inspection radiation.

The invention further provides a method of monitoring an operating condition of a radiation source arrangement, the radiation source arrangement causing an interaction between first radiation and a medium and thereby to generate second radiation by higher harmonic generation, the method comprising:

detecting third radiation resulting from an interaction between condition sensing radiation and the medium, the third radiation having a character different than the second radiation; and determining an operating condition of the radiation source arrangement based at least partly on the detected third radiation.

The invention further provides a method of controlling a radiation source arrangement by further comprising adjusting at least one operating parameter of the method automatically in response at least partly to the operating condition determined by the processor based on the detected third radiation.

The invention further provides a method of inspecting structures that have been formed on a substrate by a lithographic process, the method comprising:

illuminating a target structure with inspection radiation generated by higher harmonic generation controlled by the method according to the invention as set forth above; and detecting a portion of said inspection radiation after interaction with the target structure.

The inspection method may further comprise determining a property of the target structure based at least partly on the detected portion of said inspection radiation.

The inspection method may further comprise determining at least one performance parameter of the lithographic process based at least partly on a determined property of the target structure.

The invention further provides a manufacturing devices, the method including a lithographic process step, wherein, before or after performing said lithographic process step, properties of one or more target structures on a substrate are determined by an inspection method according to the invention as set forth above, and wherein the determined properties are used to adjust parameters of the lithographic process step for the processing of the substrate and/or further substrates.

The invention further provides a computer program product comprising machine-readable instructions for causing a processor to implement the processor and/or the controller of a radiation source arrangement according to the invention, as set forth above. The machine-readable instructions may be provided in a non-transitory storage medium.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
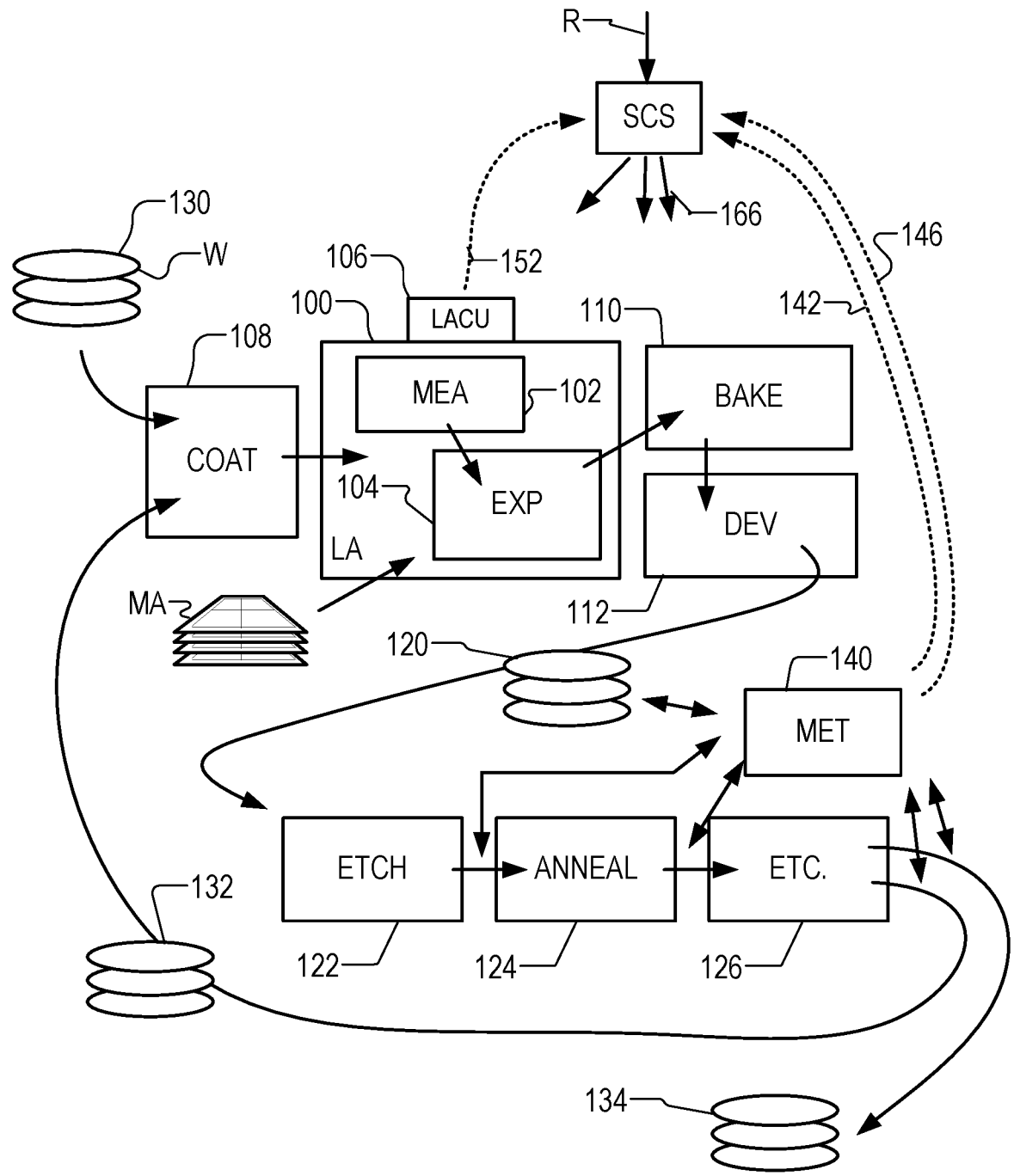
FIG. 1 depicts a lithographic apparatus together with other apparatuses forming a production facility for semiconductor devices, and including a metrology apparatus including an inspection apparatus according to an embodiment of the present invention.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, and 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Metrology apparatus 140 may if desired implement a hybrid metrology system. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122.

Each generation of lithographic manufacturing technology (commonly referred to as a technology "node") has tighter specifications for performance parameters such as CD. One of the main challenges in metrology is that the size of features within the product becomes smaller and smaller, and this smaller feature size should be reflected also in the design of metrology targets. Accordingly, metrology apparatus 140 may include an inspection apparatus designed to operate with radiation at wavelengths shorter than conventional visible or UV wavelengths. As a particular example, soft x-ray (SXR) radiation with wavelengths in the range 1-10 nm or 1-20 nm may be used, or more generally extreme ultraviolet EUV radiation may be used, with wavelengths in the range 1-100 nm.

Rather than rely for all purposes on a single inspection apparatus, a variety of inspection apparatuses may be used in practice. A hybrid metrology system may include scatterometers working at different wavelengths, and additional types of inspection apparatus, so that multiple types of measurement can be performed within the hybrid metrology system to obtain a better overall measurement of a parameter or parameters of interest on a given target structure.

Each of the inspection apparatuses within a hybrid metrology system can have a particular illumination system for radiation of a particular characteristic. More detailed examples of the types of apparatuses that can be combined is given in the pending international patent application number PCT/EP2016/080058, mentioned above. For the purposes of the present disclosure, it is assumed that metrology apparatus 140 is an inspection apparatus using soft x-ray (SXR or EUV) radiation in a waveband shorter than 100 nm. This SXR inspection apparatus can be applied as one of the inspection apparatuses in a hybrid metrology system, but can also be applied independently, if desired.

Figure 2:
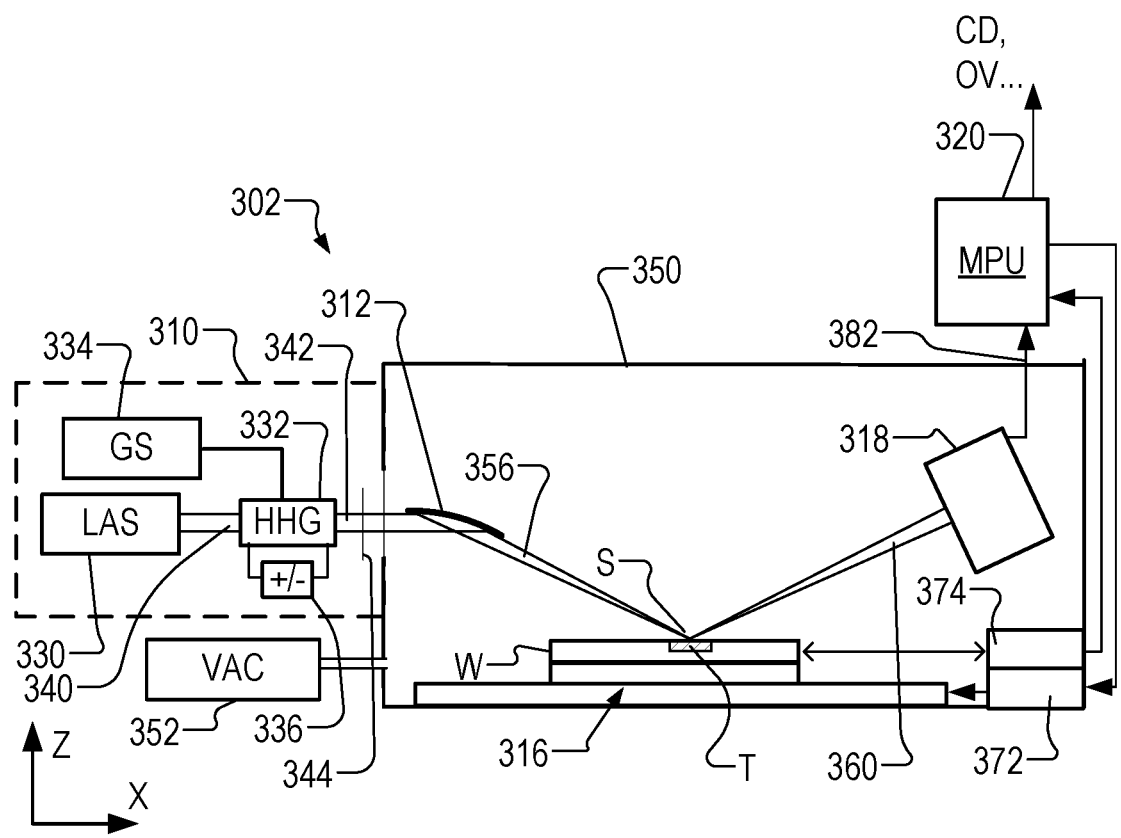
FIG. 2 shows schematically the arrangement of components in a first embodiment of an inspection apparatus including a radiation source arrangement in which the present invention may be applied.

FIG. 2 illustrates a schematic physical arrangement of an inspection apparatus 302 comprising a spectroscopic scatterometer using EUV/SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths. Inspection apparatus 302 comprises a radiation source 310, illumination system 312, substrate support 316, detection system 318 and metrology processing unit (MPU) 320. Source 310 in this example comprises a generator of EUV or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser may be for example a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. One or more wavelengths in the range 1-20 nm or 1-10 nm may be chosen, for example. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in international application number PCT/EP2016/080058, mentioned above. The focusing is performed to achieve a round or elliptical spot S under 10 μm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an SXR spectroscopic reflectometer of the kind described in US2016282282A1. Tilting of the substrate in one or more dimensions may also be provided.

To aid the alignment and focusing of the spot S with desired product structures, inspection apparatus 300 may also provide auxiliary optics using auxiliary radiation under control of metrology processor 320. Metrology processor 320 can also communicate with a position controller 372 which operates the translation stage and rotation stages. Processor 320 receives highly accurate feedback on the position and orientation of the substrate, via sensors. Sensors 374 may include interferometers, for example, which can give accuracy in the region of picometers. In the operation of the inspection apparatus 300, spectrum data 382 captured by detection system 318 is delivered to metrology processing unit 320.

As mentioned an alternative form of inspection apparatus uses SXR radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The SXR radiation may for example have wavelengths less than 100 nm, for example using radiation in the range 5-30 nm. The radiation may be narrowband or broadband in character.

Like the optical scatterometer used in today's production facilities, the inspection apparatus 400 can be used to measure structures within the resist material treated within the litho cell (After Develop Inspection or ADI), and/or to measure structures after they have been formed in harder material (After Etch Inspection or AEI). For example, substrates may be inspected using metrology apparatus 400 after they have been processed by the developing apparatus 212, etching apparatus 222, annealing apparatus 224 and/or other apparatus 226.

Figure 3:
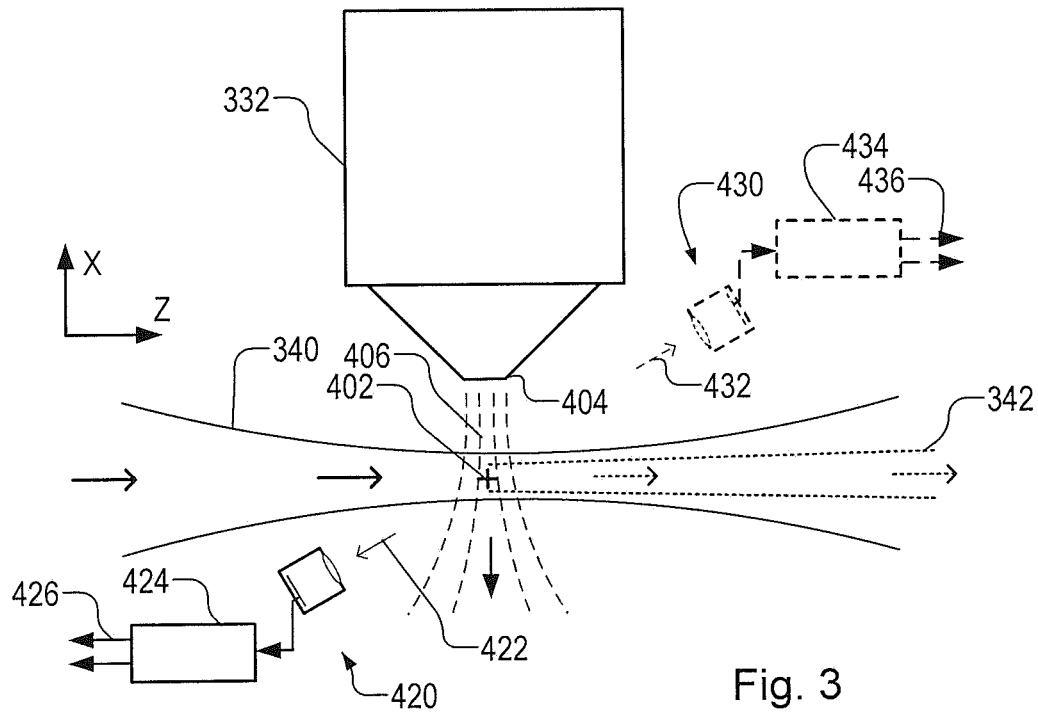
FIG. 3 shows a zone of interaction between first radiation and an HHG medium in the radiation source arrangement and including a sensor and processor illustrating the principles of the present disclosure.
Figure 4A:
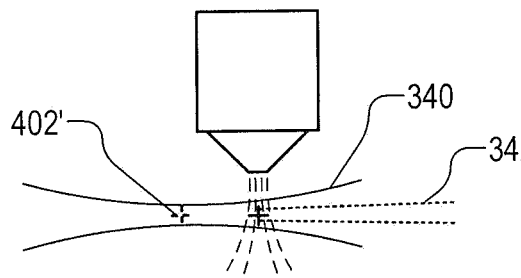
FIGS. 4(a)-4(d) illustrate some example deviations of operating conditions that can arise in the HHG radiation source arrangement.
Figure 4B:
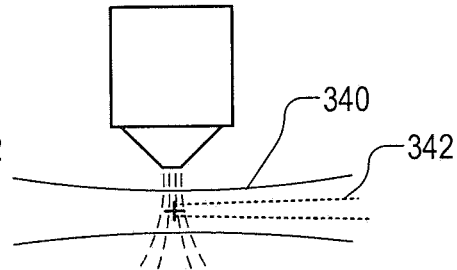
Figure 4C:
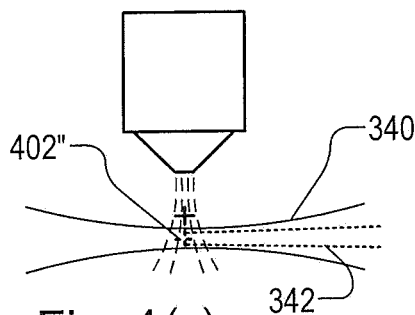
Figure 4D:
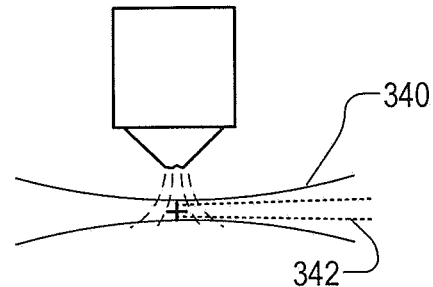

FIG. 3 shows the principle of operation of the Higher Harmonics Generation (HHG) source. In such a source, a high power femtosecond pulsed IR laser (the drive laser 330) generates the first radiation beam 340. As indicated schematically by solid lines in FIG. 3, beam 340 is focused at a point 402 in the HHG generation space. A nozzle 404 emits a jet of gas 406 containing the Ne, Ar or other atoms which are to interact with the first radiation. Around the focus position, the large, oscillating electric field caused by the first radiation displaces electrons from the gas atoms. On recombination, an energetic photon is produced, synchronously with the pump radiation but with higher harmonic energy. This results in the beam 342 of second radiation (dotted lines). Since the SXR/EUV photons of interest have a very short penetration depth in any medium, the gas jet is located in a vacuum chamber that is constantly pumped to low pressure. In another type of HHG radiation source arrangement, the gas is confined together with the pump radiation within an elongated light guide. Principles of operation are the same in either case.

As mentioned in the introduction, for the application of inspection apparatus based on HHG radiation sources in a high-volume manufacturing facility requires a degree of control and stability of the HHG radiation source arrangement beyond that provided by the manual set-up procedures and short running times of existing sources. It may be expected that the characteristics like position, shape and size of the pump radiation focus with respect to the gas jet as well as the geometric shape, flowrate, pressure and stability of the gas jet itself are important parameters to create a high power, stable output of wanted radiation.

FIG. 4 illustrates schematically some deviations in the operating condition that may degrade the operation of the HHG radiation source arrangement. In FIG. 4(*a*) the pump radiation is focused at a point 402' displaced from the gas jet, leading to a loss of maximum amplitude of the electric field within the gas jet and consequently to possible failure/degradation of the HHG process. At (b) the pump radiation is imperfectly focused, leading again to a loss of maximum amplitude of the electric field. At (c), the pump radiation is focused at a point 402" within the gas jet, but displaced from the designed location 402. The form of the gas jet may be different at this point, leading to possible failure/degradation of the HHG process, and/or leading to the second radiation 342 being position incorrectly relative to the illumination system 312. At (d) the pump radiation is focused at the desired location, but the condition of the gas jet is degraded, for example due to a wrong pressure, or wear of the nozzle, again leading to possible failure/degradation of the HHG process. These four examples are only some of the deviations that can arise. Currently, most of the parameters mentioned above are adjusted by hand while evaluating the (wavelength dependent) intensity of the generated EUV light.

The present disclosure aims to enable the provision of a more industrially-applicable source arrangement, with automatic feedback loops to stabilize and optimize the EUV output. Wear conditions other than nozzle wear may also arise, including wear of optical components that are exposed to ions from the HHG process. Such components may include vacuum system entrance windows, and pump radiation focusing optics, if it is inside the vacuum. Other conditions that may be considered "wear" conditions include variations of the gas composition and gas purity. A controlled mixture of gases may be used, which varies over time, or impurities can accumulated, for example if the gas is recycled for economic reasons.

Referring again to FIG. 3, the present application proposes to provide one or more sensors for monitoring the operating condition of the HHG radiation source arrangement, in real time, without depending on analysis of the produced second radiation 342. Various embodiments will be described, each purely by way of example. In the schematic view of FIG. 3, a sensor 420 receives third radiation 422 that arises in some way from the interaction of the first radiation and the HHG medium, in this case a gas. The third radiation is not the same as the second radiation but can be used to obtain information about operating conditions in the HHG generation space. A processor 424 receives signals from the sensor 420 in response to the third radiation, and derives one or more signals 426 (analog or digital data) representing operating conditions of the radiation source arrangement. These signals, derived from the third radiation without obstructing the wanted second radiation 342, can be used in automatic feedback control loops for controlling the operation of the radiation source arrangement 300. Alternatively or in addition, the signals representing operating conditions of the radiation source arrangement can be monitored for diagnostic purposes, for example to detect fault conditions of wear conditions, and to interrupt operation urgently, or to schedule maintenance operations.

The sensor 420 may include an optical system and a photodetector, the optical system may include one or more spectral filters, for example, imaging optical elements, for example, and/or one or more spectroscopic gratings. The photodetector may be a single element photodetector such as a photodiode, or a one- or two-dimensional detector array. The photodetector may for example comprise a segmented photodiode or an image sensor with many pixels. Examples of these will be described below. The sensor 420 is shown in a position adjacent the incoming beam 340 of first radiation, while a sensor 430 (shown dotted) can be arranged to receive third radiation 432 from a position toward the outgoing side of the higher harmonic generation space. A processor 434 can produce signals 436 in addition or as an alternative to the signals 426 generated by processor 424—where two sensors are provided, the two processors may be of course the same. The two sensors 420 and 430 may be the same or different in form to one another. They may be responsive to the same or different types of third radiation 422, 432. The signals generated by the processors 424, 434 may be combined to derive information of one operating parameter of the radiation source arrangement, or they may be used separately to indicate different parameters of the overall operating condition.

In some examples, the third radiation detected by a sensor includes a portion of the first radiation, for example a portion of infrared radiation in the pump radiation beam 340 that is reflected by the HHG gas 406, or scattered by the gas. The sensor 420, for example, may be positioned to detect a portion of the first radiation that is reflected by the medium, while the sensor 430 (for example) may be positioned to detect a portion of the first radiation that is scattered by the gas 406.

Considering the example of reflection, the power in the pump radiation required to generate sufficient EUV radiation for the SXR metrology methods of interest may be very large, for example 250 W. Therefore, even if a tiny portion is reflected it will be sufficient to use in diagnostics. The gas 406 is situated in near-vacuum environment, but the pressure of the jet itself may be for example about 10 bar. There exists therefore a small change in refractive index n when the pump radiation goes from vacuum (n=1) into the gas (n=1.006 for Xenon at 10 bar). The Fresnel reflection from such an interface is very small but non-zero: reflectivity R=$10^{-5}$. Therefore, the reflected light from the gas may have a power of around 2.5 mW. This reflected light can be utilized as third radiation for monitoring the operating condition of the HHG radiation source arrangement by the sensor 420 and processor 424. Similarly, a tiny portion of the laser radiation being scattered out of the path of the second radiation 342 by the gas 406 can be sufficient to be detected by sensor 430 and processor 434.

It will be appreciated that the boundary between the gas and the surrounding vacuum may not be a sharp step in refractive index, but rather a graduation of refractive index. The process of reflection from a gas jet is therefore more complicated in reality than simple Fresnel reflection. A simple theoretical model for the power evolution of a propagating light in graded-index medium is presented by R I Rabady "Simplified Model for Light Propagation in Graded-Index-Medium" Optics and Photonics Journal, 2013, 3, 347-350, Published Online November 2013 (http://www.scirp.org/journal/opj) (http://dx.doi.org/10.4236/opj.2013.37054A).

In addition to reflection and scattering, refraction, dispersion and absorption are other types of interaction between the condition sensing radiation and the medium. These other interactions may be considered by the skilled reader for obtaining properties of the composition and/or geometry of the medium, based on the principles and examples presented in the present disclosure.

Figure 5:
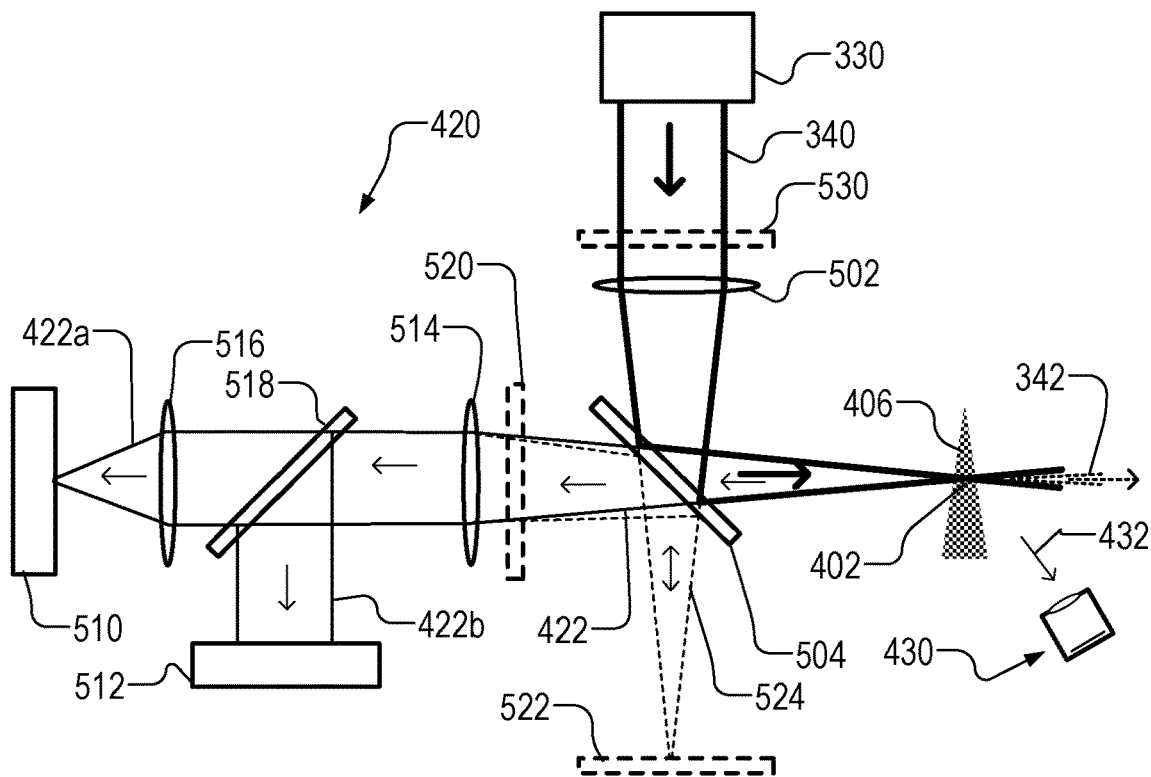
FIG. 5 illustrates a sensing arrangement according to a first embodiment of the present disclosure.

FIG. 5 shows in more detail one possible implementation of the radiation source arrangement with sensing of third radiation 422 that includes a reflected portion of the pump radiation (first radiation 340). By interaction of the first radiation 340 with gas 406 in a higher harmonic generation space, second radiation 342 including the wanted EUV wavelengths will be generated. As in the schematic illustration of FIG. 3, a sensor 420 captures third radiation 422 that is a portion of the first radiation reflected by the gas.

A laser beam delivery system includes an optical system 502 for delivering the focused laser radiation to the gas jet at the interaction location 402. In this example, the laser radiation is delivered via a beam splitter 504. All or almost all of the first radiation is reflected by the beam splitter to the interaction location 402, where a small portion of the first radiation is reflected back by the gas 406. This reflected portion is transmitted through beam splitter 504 and enters the sensor 420 as third radiation 422.

As mentioned above, the sensor 420 can take many forms, typically comprising some kind of optical system and one or more kinds of photodetector. In the example of FIG. 5, sensor 420 includes a first photodetector 510 which is for example a CCD or CMOS image sensor and a second photodetector 512 which is also for example a CCD or CMOS image sensor. An optical system of the first sensor 420 comprises focusing elements 514 and 516 which form an image of the focused laser radiation on the gas 406 on the first photodetector 510 using at least a first portion 422a of the third radiation 422 of the laser radiation. A beam splitter 518 (alternatively a movable mirror) diverts another portion 422b of the third radiation 422 onto the second photodetector 512. This portion is taken from a parallel part of the beam between the focusing elements 54, 516, so as to form a pupil image (angular resolved) image of the third radiation. Thus the first photodetector 510 records the spatial distribution of the first radiation where it enters the gas 406, while the second photodetector 512 records the angular distribution of the reflected first radiation.

A wavelength selective filter (spectral filter) 520 is optionally provided, to select only the wanted third radiation 422 and to exclude radiation of other wavelengths that might be emitted by the interaction of the laser radiation and the gas 406. For example, while the pump radiation may have a wavelength around 1 micron, radiation of shorter wavelengths may be generated by (for example) ionization and/or fluorescence within the gas (including any impurities that may be present) and/or other components of the system. By eliminating these components, signal to noise ratio of the detection of the wanted third radiation can be increased. Suitable bandpass filters are widely available in the wavelength range of the pump radiation considered.

On the other hand, in other embodiments, the sensor 420 and associated processor may be deliberately arranged to respond to third radiation that is not a reflected portion of the first radiation. In that case, the function of the filter 520 may be to cut out the infrared first radiation, and to pass the other radiation (fluorescence, ionization etc.). Yet further embodiments may be responsive to both types of third radiation, either by providing additional beam paths and photodetectors with appropriate filters (e.g. dichroic filters to minimize signal loss), or by making filter 520 switchable between different characteristics. In addition to wavelength selection, polarization may be selectable as well.

In addition to detecting the angular and/or spatial distribution of intensity of the reflected radiation, optionally, the sensor 420 may be enabled to detect the angular and/or spatial distribution of phase of the reflected radiation. One way to enable this is to provide a beam of reference radiation using reflector 522, shown in broken lines as an optional feature. A portion 524 of the first radiation 340 is allowed to pass through the beam splitter 504 to be reflected by reflector 522. This is then re-reflected by the beam splitter 504 into the same path as the third radiation 422 in the optical system of detector 420. Here the reference radiation interferes with the light reflected from the gas. The resulting interference pattern on photodetector 512 visualizes the wavefront of the light reflected from the gas 406, including both intensity and phase information.

Given the high power of the pump radiation 340, the beam splitter 504 should reflect a very significant part of the light, as this will be used for the actual EUV generation. For example, it could reflect 99.9%. In that case, the (already small) portion of the laser radiation that is reflected from the gas is diminished further by a factor $10^{-3}$. The other optical elements (514, 516, 520, 522) can be coated such that additional losses are marginal. If the incoming power from the laser is 250 W, say, the amount of light expected on the detectors after reflection by the gas and transmission by the beam splitter would be about 2.5 mW (microwatt). With commercially available cameras, this amount of radiation can be detectable even if it is spread over, for example, a hundred pixels on the image sensor. The optical system of the sensor 420 may be provided already in a commercially-available camera, or may be custom-built for use with a commercially-available or customized photodetector. Depending on the amount of light available on the detector, the bandwidth (sample rate or frame rate) can be chosen (for example 1 Hz, or 10 Hz or 1 kHz) to achieve a desired signal to noise ratio frequently enough for real-time monitoring and/or control of the operating conditions in the HHG radiation source arrangement.

The above calculation of the amount of light on the detectors assumed the refractive index of a typical neutral gas. However, it is to be expected that reflectivity of the HHG medium will be enhanced by the fact that the pump radiation partly ionizes the gas. Apart from the benefit in terms of signal strength, an increase in reflected intensity can be used as a measure of conditions within the HHG medium, as an operating condition of the radiation source apparatus.

A further optional element in the laser beam delivery system is a compensatory optical device 530 for wavefront correction. European patent application no. 16188816.9 dated Sep. 14, 2016, not published at the present priority date, describes the correction of wavefronts to correct for a "slope error" of the illumination system 412 optical element(s) in an inspection apparatus, and therefore minimize blurring of the measurement spot. The European patent application describes embodiments in which calibration to correct this slope error is a one-time calibration: once the compensatory optical device is configured, it is not expected to require further adjustment. In such an embodiment, the calibration step may be performed only once during construction. In other embodiments, the calibration step may have to be repeated periodically. To allow real-time, closed-loop control of the wavefront, compensatory optical device 530 may be a programmable spatial light modulator (SLM). Needless to say, the real implementation of the beam delivery system may include several optical elements, and not a single lens as suggested in the simplified drawing. Note that the drawing suggests a transmissive SLM device purely for simplicity of illustration. Because of the power in the laser beam, the practical implementation may use a reflective type SLM (e.g. a digital micromirror device (DMD) array).

As shown schematically in FIG. 5, a further sensor 430 can be provided to capture another type of radiation as third radiation 432 for use in diagnostic and/or control systems. Examples of second sensor are mentioned already above, with reference to FIG. 3.

Figure 6:
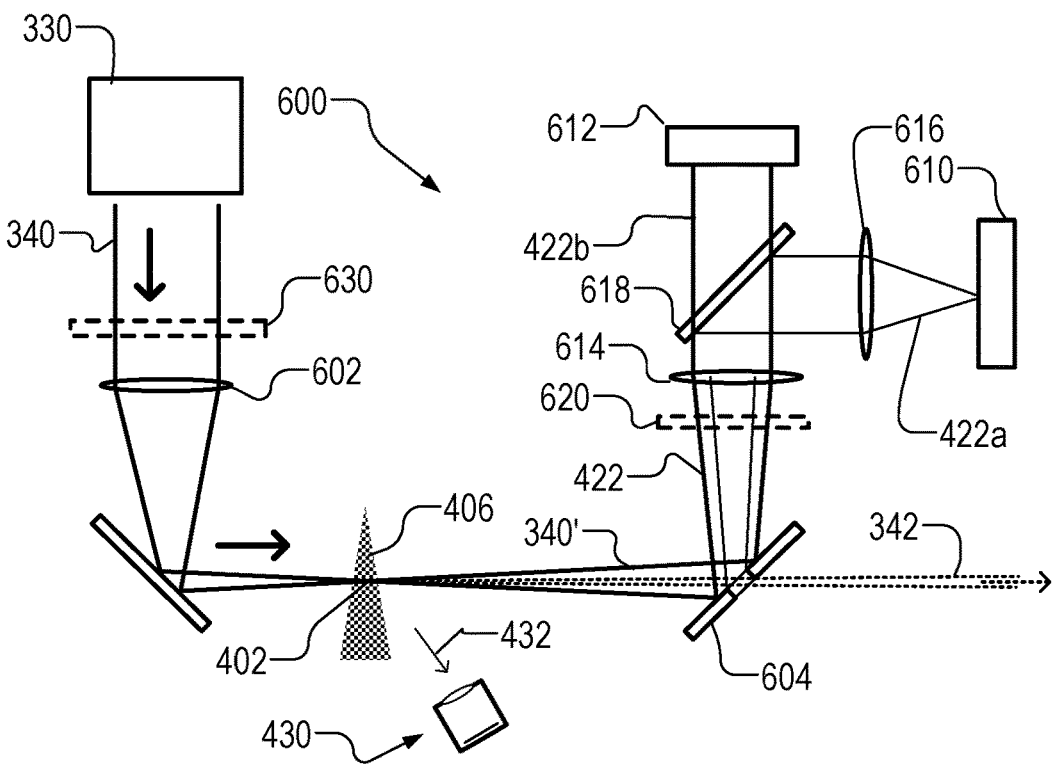
FIG. 6 illustrates a sensing arrangement according to a second embodiment of the present disclosure.

FIG. 6 illustrates a different arrangement of sensor which could be used as an alternative or in addition to the sensor 420 and/or the sensor 430 of the previous examples. The pump radiation that is transmitted through the gas 406 has a much higher intensity than the reflected light used by sensor 420. FIG. 6 depicts a sensor 600 in which this light could be used to determine an operating condition of the HHG radiation source arrangement for diagnostics and/or control. Components having similar functions to the components 502-530 are numbered 602-630 in this example, and only the differences between the two sensors 420, 600 will be described in detail.

In the example of FIG. 6, the first radiation 340 from the drive laser does not pass through a beam splitter, and no arrangement is provided for detecting radiation reflected by the gas 406. Sensor 600 could in practice be provided as in additional to the reflection detector 420, not only as an alternative. In that case the beam splitter 504 and other components of FIG. 5 could be provided in addition to those shown in FIG. 6. For the purposes of sensor 600, however, the transmitted beam, comprising a residual portion 340' of the first radiation and the second radiation 342 including EUV wavelengths, is directed to a mirror 604 after interaction with the HHG medium, gas 406. The transmitted pump radiation usually has a larger cone of divergence than the EUV second radiation, by the nature of the HHG process. Placing a hole in the mirror 604 allows the EUV to be transmitted to the illumination system 312 of the inspection apparatus or other EUV optical system, while the surrounding annulus of pump radiation is reflected into the optical system of sensor 600.

Similarly to the sensor 420 of FIG. 5, sensor 600 has first and second photodetectors 610 and 612. A spatial distribution of the transmitted first radiation can be detected in an image plane by photodetector 610, while an angular distribution of the transmitted first radiation can be detected in a pupil plane by photodetector 612. Other options and alternatives described above with reference to sensor 420 apply equally to the construction and operation of sensor 600. The higher intensity of the transmitted first radiation can result in better signal to noise on the detectors, compared with the sensor 420. On the other hand, the fact that the light travelled through the gas jet and the omission of the central cone of the beam may limit the types of information available.

As mentioned above, the choice of third radiation for monitoring of the operating condition of the HHG radiation source arrangement is not limited to portions of the first radiation that are reflected and/or scattered by the HHG medium. Different types of third radiation already mentioned include any kind of photoluminescence of the medium that is excited by the first radiation, such as fluorescence and/or light emitted by ionization of the medium to form a plasma.

Another type of radiation that may be used as third radiation arising from interaction of the first radiation with the medium is radiation generated by harmonic generation at lower harmonics than the ones used as the second radiation. As is known, HHG processes tend to excite all harmonics (or at least all odd-numbered harmonics) up to a certain cut-off point that depends on the choice of medium, pump wavelength and operating conditions. Assuming, for the sake of example, first radiation (pump radiation) of wavelength 1000 nm, then a $3^{rd}$ harmonic and a $5^{th}$ harmonic will have wavelengths 333 nm and 200 nm respectively. Only the ($10^{th}$ or) $11^{th}$ and higher harmonics will have wavelengths in the EUV/SXR range shorter than 100 nm.

The lower harmonics, which may also be stronger than the higher harmonics, can be used as third radiation for sensing operating conditions within the radiation source apparatus, in accordance with the principles of the present disclosure. In addition to being more powerful, the lower harmonics are generally emitted with a wider angular distribution than the higher harmonics. Therefore the annular mirror 604 in the example of FIG. 6 will be operable to direct the lower harmonics as third radiation 422 to the sensor 600, while the higher harmonics pass through the center hole, as second radiation 342. The annular mirror 604 has a second function of blocking at least a portion of the (unwanted) lower harmonics from entering the illumination system of the inspection apparatus. There is not necessarily a hard definition of "higher" versus "lower" harmonics, but the $3^{rd}$ and $5^{th}$ harmonics can be considered "lower" harmonics for the purposes of the present disclosure, and the $11^{th}$ harmonic upward can be considered "higher harmonics".

In the above described examples, the first radiation (that is, the radiation which causes generation of the second radiation by higher harmonic generation) serves as the condition sensing radiation, which interacts with the HHG medium to provide the third radiation for use in determining an operating condition of the radiation source arrangement. In general, however, the third radiation need not be radiation caused by interaction of the first radiation (pump radiation) with the medium at all. Condition sensing radiation may be generated separately from the first radiation, and may have different characteristics. This will now be illustrated with reference to FIG. 7.

Figure 7:
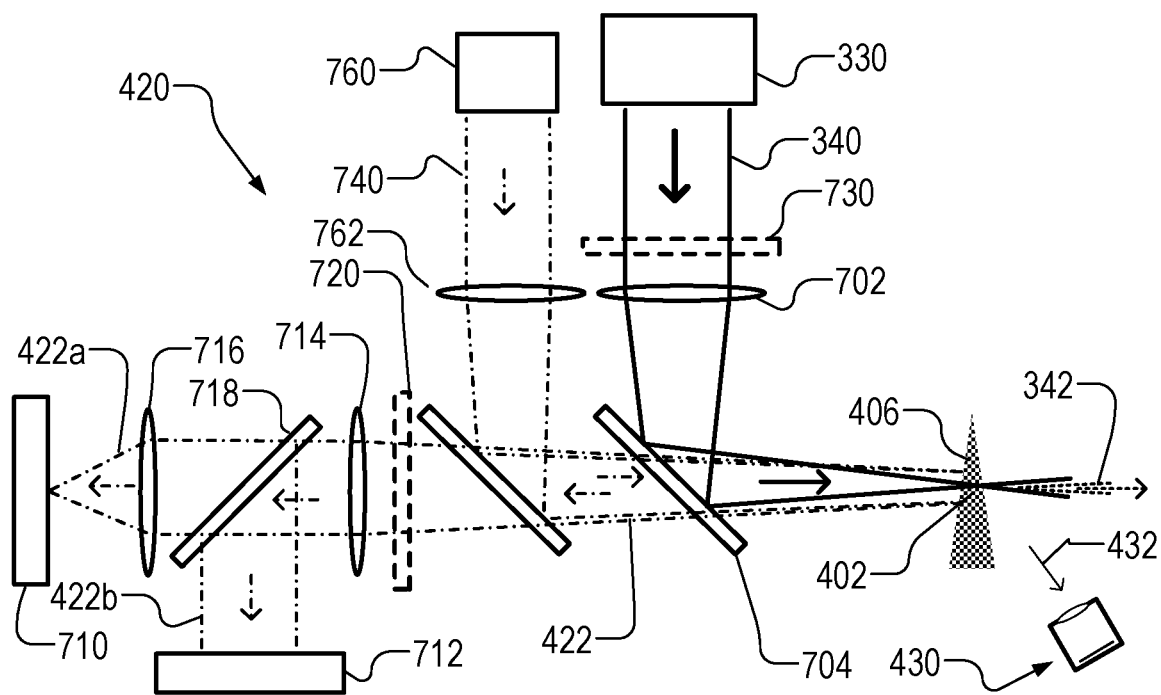
FIG. 7 illustrates schematically a sensing arrangement according to a third embodiment of the present disclosure.

In FIG. 7, an arrangement similar to FIG. 5 is shown, with components 702-730 corresponding in function to components 502-530 in FIG. 5. A second laser 760 and optical system 762 are used to direct condition sensing radiation 740 towards the interaction point 402. The condition sensing radiation in this case has a different wavelengths and/or different timing and/or different direction, relative to the first radiation. In the illustrated example, a beam splitter 764 is used to direct the condition sensing radiation generally in parallel with the first radiation. In other implementations, it may be easier to direct the condition sensing radiation from a complete different direction, simplifying the design of the delivery of the high power pump radiation. Condition sensing radiation 740 is illustrated schematically with dot-dash lines. As an example, the condition sensing radiation 740 can be generated by an independent laser 760 tuned to some fluorescent excitation line of the gas 406 (to image the gas flow more directly). The condition sensing radiation 740 may alternatively be derived from the drive laser 330, for example frequency doubled to increase the Rayleigh scattering and displaced in time sufficiently to not disturb the HHG process. As illustrated in FIG. 7, this condition sensing radiation may even be defocused on purpose, to illuminate a larger part of the jet.

In yet other implementations, it may be preferred to inject the condition sensing radiation through the same optical system 702 as the pump radiation, for example so that the focus performance of the optical system 720 can be monitored, and not only the condition of the gas jet. In a more complex embodiment, the focus position may be probed and information on the HHG process obtained, even when using a different condition sensing radiation. For example, a second radiation source could be used to perform measurements using stimulated emission depletion microscopy (STED) or "pump-probe" techniques (the first radiation being the pump, the condition sensing radiation being the probe).

Again, sensing using this different radiation can be applied in parallel with or as an alternative to sensing using reflected or scattered pump radiation. The different radiations can be detected with the same photodetectors or separate photodetectors, as a matter of implementation. In all cases the third radiation, being distinct from the second radiation, can be detected without reducing or degrading the second radiation that is the main product of the radiation source arrangement. This benefit may be obtained in particular because the third radiation 422 is traveling from the interaction point 402 in a different direction (or directions) than the second radiation 342.

Figure 8:
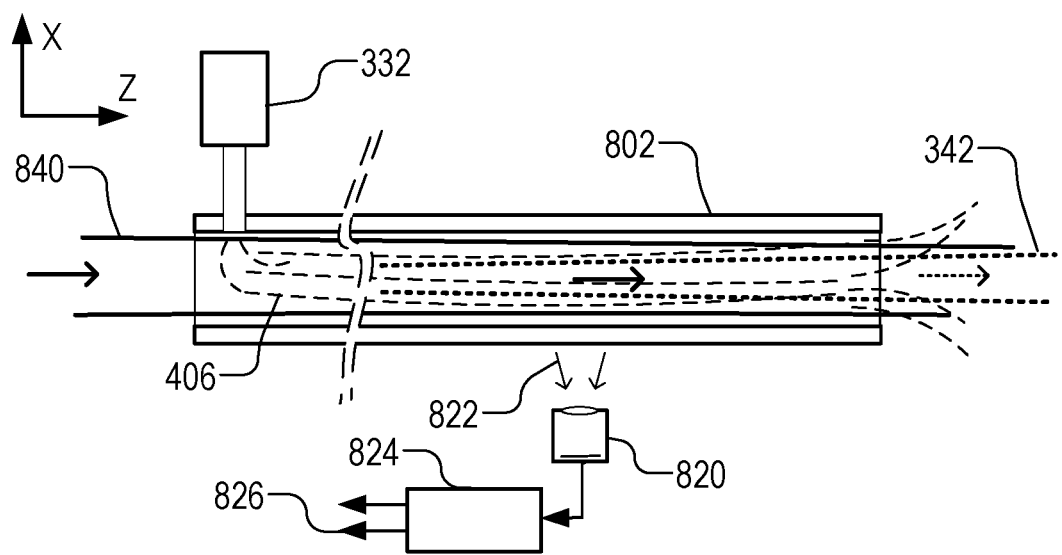
FIG. 8 illustrates schematically a sensing arrangement according to a fourth embodiment of the present disclosure.

FIG. 8 illustrates yet another example, in which the generation of second radiation occurs in an elongated interaction space. First radiation 840 is confined within a light guide 802 which is flooded with gas 406 from gas source 332 (FIG. 2). The efficiency of conversion to higher harmonic radiation is enhanced by the prolonged mutual confinement of the first radiation and the gas. Otherwise the principle of operation of the radiation source arrangement is the same as for the gas jet examples described above.

Radiation other than the first radiation 840 and the second radiation 342 may be generated by interaction of the first radiation and the gas 406, by any of the photoluminescence mechanisms mentioned above, and/or by harmonic generation of the lower harmonics. Being of a direction and/or wavelength different to the first radiation 840, it can be arranged that this other radiation will leak from the light guide 802. This can be used as third radiation 822, and detected by sensor 820 to monitor and/or control the operating condition of the radiation source apparatus. Variations can be applied in this type of arrangement, just as described above for the examples having a gas jet in a vacuum.

Figure 9:
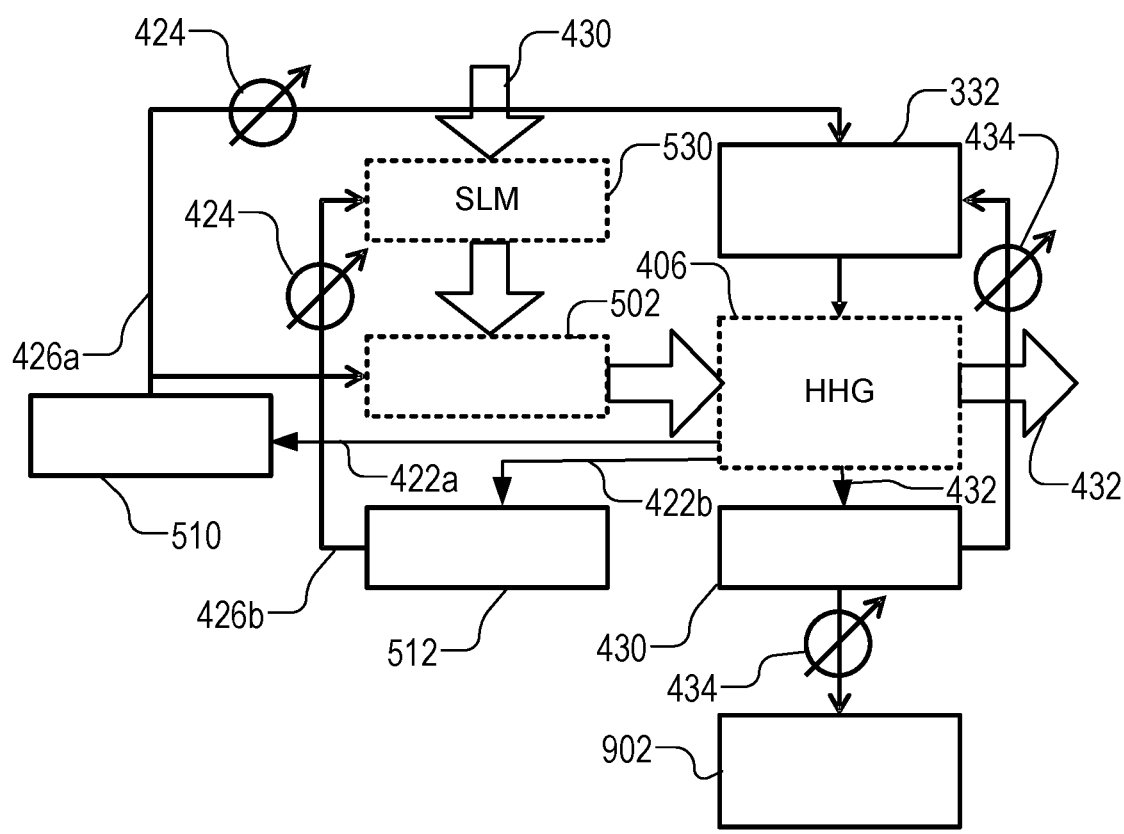
FIG. 9 illustrates schematically the flow of sensor signals and feedback control signals in example embodiments of the present disclosure.

In any of the above examples, the information obtained from the sensors, for example radiation spot intensity and intensity distribution, or wave front of the reflected light can be used to monitor and/or adjust numerous parameters of the operating radiation source arrangement. Examples of parameters and conditions that can be monitored in real time (and adjusted automatically or manually) include:

1) Direction of the pump radiation
2) Positioning of the pump radiation focus
3) The wave front of the pump radiation (for example by modifying or reprogramming a Spatial Light Modulator 530, 630, 730)
4) Gas flow settings, nozzle shape and other gas jet parameters
5) Gas jet nozzle deterioration
6) Gas composition and purity FIG. 9 is an example block diagram of a control system of the radiation source arrangement. Components identifiable in the hardware drawings of FIGS. 3 and 5 are labeled with the same reference signs. For example, the wavefront compensating device 510 and the gas 406 are represented, and the pump radiation (first radiation) 430 and the output EUV radiation (second radiation) 432. Different types of third radiation 422a, 422b, 432 are detected by detectors 510, 512, 430 respectively, and operating parameters of the hardware elements are adjusted by processors 424, 434 to implement feedback control and stabilize operation of the radiation source arrangement over a prolonged period.

For example, the wavefront compensating device 510 is controlled by processor 424 in response to the pupil images detector by photodetector 512. Gas supply 331 is controlled in response to an operating condition determined from certain characteristics of the image of the first radiation spot reflected from the gas jet, detected by photodetector 510. Beam delivery optical system 502 is also controlled in response to focus conditions determined from different characteristics of the same image. The second sensor 430 measures scatter of the radiation and processor 434 also influences operation of the gas supply 332. In addition, processor 434 generates an alert message relating to the condition of the gas nozzle.

In this example, the functions of hardware control are implemented in the same processing hardware as the deriving of operation conditions from the sensor signals. In other implementations, processing of monitoring signals and control functions may be implemented in separate processing hardware. The processors 424 and 434 can be implemented in separate hardware or common hardware. Once the sensor signals are digitized, the analysis of them to derive operating conditions and/or to determine appropriate feedback control actions can be implemented by suitable programming, with fixed responses and/or adaptive and machine learning responses.

In association with the hardware components of the inspection apparatus, an embodiment may therefore include a computer program containing one or more sequences of machine-readable instructions and/or functional data describing the a method of determining an operating condition of a radiation source arrangement, and/or for controlling the radiation source arrangement in response to the determined condition. This computer program may be executed for example within metrology processing unit MPU in the apparatus of FIGS. 2 to 9 and/or the supervisory control system SCS of Figure. There may also be provided a non-transient data storage medium (e.g., semiconductor memory, magnetic or optical disk) having such a computer program stored therein. Where an existing radiation source arrangement is already in production and/or in use, a modified embodiment can be implemented by the provision of an updated computer program product for causing a processor to perform one or more of the methods described herein.

Further modifications of the laser radiation delivery system and other components of the HHG radiation source can be included, which are not detailed herein. Some of these modifications are disclosed for example in European patent application number 16198346.5 dated Nov. 11, 2016, not been published at the priority date of the present application. Other modifications are disclosed in U.S. patent application Ser. No. 15/388,463 and international patent application PCT/EP2016/080103, both claiming priority from European patent application no. 15202301.6 dated Dec. 23, 2015 also not yet been published at the priority date of the present application. European patent application no. 16188816.9 has already been mentioned. The contents of all these applications are incorporated herein by reference, and the techniques described therein can be used in combination with the techniques of the present disclosure.

While the present disclosure presents EUV and SXR radiation between 1-100 nm as an example of particular interest for current technological development, shorter wavelengths in the "harder" x-ray range may be used, having wavelengths for example less than 1 nm and potentially less than 0.1 nm. While inspection by reflection of radiation is described by way of example, the principles of the present disclosure may also be applied in transmissive arrangements, particularly where shorter x-ray radiation can penetrate through the whole substrate.

Figure 10:
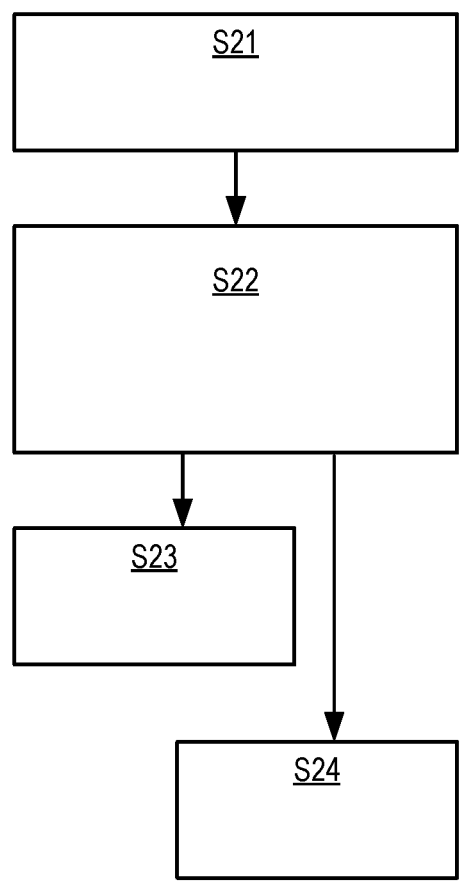
FIG. 10 is a flow chart illustrating a method of controlling performance of a metrology method and/or of a lithographic manufacturing process using measurements made by the hybrid metrology system of FIG. 1.

FIG. 10 illustrates the application of an inspection apparatus such as inspection apparatus 400, in the control of a lithographic manufacturing system of the type illustrated in FIG. 1. The steps will be listed here, and then explained in more detail:

S21: Process wafer to produce structures on substrate
S22: Measure CD and/or other parameter across substrate
S23: Update metrology recipe
S24: Update lithography and/or process recipe At step S21, structures are produced across a substrate using the lithographic manufacturing system. At S22, the metrology apparatus 140 and optionally other metrology apparatus and information sources are used to measure a property of the structures across the substrate. In accordance with the principles of the present disclosure, set forth above, properties of one or more targets are measured using EUV or SXR radiation generated by a radiation source arrangement monitored and controlled as described above.

At step S23, optionally, metrology recipes and calibrations of the metrology apparatus are updated in light of the measurement results obtained. Referring again to the discussion of FIGS. 5 and 6 above, a metrology recipe might specify which portions of the diffraction spectra to compare for the most reliable asymmetry measurement. The recipe may specify settings of the laser radiation delivery system also, for example to control spectrum and/or polarization of the SXR radiation.

At step S24, measurements of overlay or other performance parameters are compared with desired values, and used to update settings of the lithographic apparatus and/or other apparatus within the lithographic manufacturing system.

Further embodiments are disclosed in the subsequent numbered clauses:

1. A radiation source arrangement operable to cause an interaction between first radiation and a medium and thereby to generate second radiation by higher harmonic generation, the radiation source arrangement further comprising:
    at least one sensor for detecting third radiation resulting from an interaction between condition sensing radiation and the medium, the third radiation having a character different than the second radiation; and
    a processor for determining an operating condition of the radiation source arrangement based at least partly on the detected third radiation.

2. A radiation source arrangement as defined in clause 1 wherein the first radiation serves also as said condition sensing radiation.

3. A radiation source arrangement as defined in clause 1 wherein the condition sensing radiation is different to the first radiation.

4. A radiation source arrangement as defined in any preceding clause wherein said sensor is arranged to receive said third radiation traveling from the medium in a direction different to the second radiation.

5. A radiation source arrangement as defined in any preceding clause wherein the detected third radiation includes a portion of the condition sensing radiation.

6. A radiation source arrangement as defined in clause 5 wherein the detected third radiation includes a portion of the condition sensing radiation that is reflected by the medium.

7. A radiation source arrangement as defined in clause 5 wherein the gaseous medium is provided in the form of a gas jet in a near-vacuum environment, the third radiation comprising a portion of the condition sensing radiation that is reflected by the gas jet.

8. A radiation source arrangement as defined in clause 5 wherein the detected third radiation includes a portion of the condition sensing radiation that is scattered by the medium.

9. A radiation source arrangement as defined in clause 5, 6 or 7 wherein the detected third radiation includes a portion of the condition sensing radiation that is transmitted by the medium outside an angular distribution of the second radiation.

10. A radiation source arrangement as defined in any preceding clause wherein the detected third radiation includes radiation that is emitted by the medium due to excitation of the medium by the condition sensing radiation.

11. A radiation source arrangement as defined in any preceding clause wherein the detected third radiation includes radiation that is generated by harmonic generation at one or more harmonics lower than the second radiation.

12. A radiation source arrangement as defined in any preceding clause configured to confine the first radiation and the medium in an elongate waveguide to promote their interaction, wherein the third radiation includes radiation escaping through a wall of said waveguide.

13. A radiation source arrangement as defined in any preceding clause wherein the sensor is operable to detect a distribution of intensity of said third radiation in the vicinity of the medium, and the processor is operable to determine said operating condition of the arrangement based at least partly on said distribution of intensity.

14. A radiation source arrangement as defined in any preceding clause wherein the sensor is operable to detect a distribution of phase and intensity in the vicinity of the medium and the processor is operable to determine said operating condition of the arrangement based at least partly on said distribution of phase and intensity.

15. A radiation source arrangement as defined in clause 14 wherein the sensor is operable to cause interference between the third radiation and a reference beam, the reference beam comprising a portion of the condition sensing radiation that has not interacted with the medium.

16. A radiation source arrangement as defined in any preceding clause wherein the sensor is operable to discriminate two or more spectral components within the third radiation and the processor is operable to determine said operating condition of the arrangement based at least partly on a spectral distribution of phase and intensity.

17. A radiation source arrangement as defined in any preceding clause wherein the second radiation includes wavelengths shorter than 100 nm, while the first radiation comprises wavelengths longer than 100 nm.

18. A radiation source arrangement as defined in any preceding clause wherein the medium is a gaseous medium.

19. A radiation source arrangement as defined in any preceding clause further comprising a controller for adjusting at least one operating parameter of the radiation source arrangement automatically in response at least partly to the operating condition determined by the processor based on the detected third radiation.

20. A radiation source arrangement as defined in clause 19 wherein the adjusted operating parameter is an operating parameter of a beam delivery system of the first radiation, such as a beam width, an axial focus position, a transverse focus position or a wavefront.

21. A radiation source arrangement as defined in clause 19 or 20 wherein the adjusted operating parameter is a parameter of the medium.

22. A radiation source arrangement as defined in clause 21 wherein the medium is a gas jet and the adjusted operating parameter is an operating parameter of a gas delivery system.

23. A radiation source arrangement as defined in any preceding clause wherein said processor is operable to output diagnostic information based at least partly on the determined operating condition.

24. A radiation source arrangement as defined in clause 23 wherein the medium is a gas jet and the diagnostic information relates to a wear condition of a part of the radiation source arrangement.

25. An inspection apparatus comprising an illumination system for delivering inspection radiation to a target structure and a detection system for detecting said inspection after interaction with the target structure, and wherein the illumination system includes a radiation source arrangement as defined in any preceding clause, the second radiation generated by higher harmonic generation being used as said inspection radiation.

26. An inspection apparatus as defined in clause 25 wherein the inspection radiation includes wavelengths less than 100 nm.

27. An inspection apparatus as defined in clause 26 further comprising a processing arrangement for determining a property of the target structure based on detected inspection radiation.

28. An inspection apparatus as defined in clause 27 wherein said processing arrangement is further arranged to calculate a first performance parameter of a lithographic process based at least partly on the determined property of the target structure.

29. A method of monitoring an operating condition of a radiation source arrangement, the radiation source arrangement causing an interaction between first radiation and a medium and thereby to generate second radiation by higher harmonic generation, the method comprising:
  detecting third radiation resulting from an interaction between condition sensing radiation and the medium, the third radiation having a character different than the second radiation; and
  determining an operating condition of the radiation source arrangement based at least partly on the detected third radiation.

30. A method as defined in clause 29 wherein the first radiation serves also as said condition sensing radiation.

31. A method as defined in clause 29 wherein said condition sensing radiation is delivered to the medium in addition the first radiation.

32. A method as defined in any of clauses 29 to 31 wherein said third radiation travels from the medium in a direction different to the second radiation.

33. A method as defined in any of clauses 29 to 32 wherein the detected third radiation includes a portion of the condition sensing radiation.

34. A method as defined in clause 33 wherein the detected third radiation includes a portion of the condition sensing radiation that is reflected by the medium.

35. A method as defined in clause 34 wherein the gaseous medium is provided in the form of a gas jet in a near-vacuum environment, the third radiation comprising a portion of the condition sensing radiation that is reflected by the gas jet.

36. A method as defined in clause 33 wherein the detected third radiation includes a portion of the condition sensing radiation that is scattered by the medium.

37. A method as defined in clause 34, 35 or 36 wherein the detected third radiation includes a portion of the condition sensing radiation that is transmitted by the medium outside an angular distribution of the second radiation.

38. A method as defined in any of clauses 29 to 37 wherein the detected third radiation includes radiation that is emitted by the medium due to excitation of the medium by the condition sensing radiation.

39. A method as defined in any of clauses 29 to 38 wherein the detected third radiation includes radiation that is generated by harmonic generation at one or more harmonics lower than the second radiation.

40. A method as defined in any of clauses 29 to 39 wherein the first radiation and the medium are confined in an elongate waveguide to promote their interaction, and wherein the third radiation includes radiation escaping through a wall of said waveguide.

41. A method as defined in any of clauses 29 to 40 wherein a distribution of intensity of said third radiation in the vicinity of the medium is detected, and said operating condition of the arrangement is determined based at least partly on said distribution of intensity.

42. A method as defined in any of clauses 29 to 41 wherein a distribution of phase and intensity in the vicinity of the medium is detected, and said operating condition of the arrangement is determined based at least partly on said distribution of phase and intensity.

43. A method as defined in clause 42 wherein interference is caused between the third radiation and a reference beam, the reference beam comprising a portion of the condition sensing radiation that has not interacted with the medium.

44. A method as defined in any of clauses 29 to 43 wherein two or more spectral components within the third radiation are discriminated and the processor is operable to determine said operating condition of the arrangement based at least partly on a spectral distribution of phase and intensity.

45. A method as defined in any of clauses 29 to 44 wherein the second radiation includes wavelengths shorter than 100 nm, while the first radiation comprises wavelengths longer than 100 nm.

46. A method as defined in any of clauses 29 to 45 wherein the medium is a gaseous medium.

47. A method as defined in any of clauses 29 to 46 further comprising adjusting at least one operating parameter of the method automatically in response at least partly to the operating condition determined by the processor based on the detected third radiation.

48. A method as defined in clause 47 wherein the adjusted operating parameter is an operating parameter of a beam delivery system of the first radiation, such as a beam width, an axial focus position, a transverse focus position or a wavefront.

49. A method as defined in clause 47 or 48 wherein the adjusted operating parameter is a parameter of the medium.

50. A method as defined in clause 49 wherein the medium is a gas jet and the adjusted operating parameter is an operating parameter of a gas delivery system.

51. A method as defined in any of clauses 29 to 50 further comprising outputting diagnostic information based at least partly on the determined operating condition.

52. A method as defined in clause 51 wherein the medium is a gas jet and the diagnostic information relates to a wear condition of a part of the radiation source arrangement.

53. A method of inspecting structures that have been formed on a substrate by a lithographic process, the method comprising:
    illuminating a target structure with inspection radiation generated by higher harmonic generation controlled by the method of any of clauses 47 to 51; and
    detecting a portion of said inspection radiation after interaction with the target structure.

54. A method as defined in clause 53 further comprising determining a property of target structure based at least partly on the detected portion of said inspection radiation.

55. A method as defined in clause 54 further comprising determining at least one performance parameter of the lithographic process based at least partly on determined property of the target structure.

56. A method of manufacturing devices, the method including a lithographic process step, wherein, before or after performing said lithographic process step, properties of one or more target structures on a substrate are determined by a method as defined in any of clauses 53 to 56 and wherein the determined properties are used to adjust parameters of the lithographic process step for the processing of the substrate and/or further substrates.

57. A computer program product comprising machine-readable instructions for causing a processor to implement the processor of a radiation source arrangement according to any of clauses 1 to 24.

58. A computer program product comprising machine-readable instructions for causing a processor to implement the controller of a radiation source arrangement according to any of clauses 19 to 22.

If in this document the term "metrology apparatus" is used, one may also read the term "inspection apparatus" at that position, and vice versa. In the context of this document said apparatuses can be used to determine characteristics of interest of a structure on a substrate. The characteristics of interest may be measurement values and may also be deviations from an expected pattern, such as the absence of structures, the presence of unexpected structures and changes in the expected pattern.

The target structures described above may be metrology targets specifically designed and formed for the purposes of measurement, in other embodiments, properties may be measured on targets which are functional parts of devices formed on the substrate. Many devices have regular, periodic structures akin to a grating. The term "target", "grating" or "periodic structure" of a target as used herein does not require that the applicable structure has been provided specifically for the measurement being performed. Further, pitch P of the metrology target is close to the resolution limit of the optical system of the measurement tool, but may be much larger than the dimension of typical product features made by a patterning process in the target portions C. In practice the features and/or spaces of the gratings may be made to include smaller structures similar in dimension to the product features.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A radiation source arrangement configured to cause an interaction between a first radiation and a gaseous medium and thereby generate a second radiation by higher harmonic generation, the radiation source arrangement further comprising:
    at least one sensor configured to detect a third radiation resulting from an interaction between a condition sensing radiation and the gaseous medium, the second radiation comprising radiation having a different wavelength than the third radiation, wherein the third radiation includes a portion of the condition sensing radiation that is scattered by the gaseous medium, the at least one sensor comprising a first photodetector, a second photodetector, and one or more optical elements; and a processor configured to:
monitor an operating condition of the radiation source arrangement based at least partly on the third radiation and results from the first and the second photodetectors.

2. The radiation source arrangement of claim 1, wherein the first radiation is the condition sensing radiation.

3. The radiation source arrangement of claim 1, wherein the condition sensing radiation is different from the first radiation.

4. The radiation source arrangement of claim 1, wherein the sensor is arranged to receive the third radiation traveling from the gaseous medium in a direction different than a direction of the second radiation.

5. The radiation source arrangement of claim 1, wherein the at least one sensor comprises a first sensor configured to detect a first type of the third radiation and a second sensor configured to detect a second type of the third radiation, wherein the first type of the third radiation is the portion of the condition sensing radiation that is scattered by the gaseous medium.

6. The radiation source arrangement of claim 5, wherein the second type of the third radiation includes a portion of the condition sensing radiation that is reflected by the gaseous medium.

7. The radiation source arrangement of claim 5, wherein the gaseous medium is provided in a form of a gas jet in a near-vacuum environment, the second type of the third radiation comprising a portion of the condition sensing radiation that is reflected by the gas jet.

8. The radiation source arrangement of claim 5, wherein the second type of the third radiation includes a portion of the condition sensing radiation that is transmitted by the gaseous medium outside an angular distribution of the second radiation.

9. The radiation source arrangement of claim 1, wherein the third radiation includes radiation that is emitted by the gaseous medium due to an excitation of the gaseous medium by the condition sensing radiation.

10. The radiation source arrangement of claim 1, wherein the third radiation includes radiation that is generated by the higher harmonic generation at one or more harmonics lower than the second radiation.

11. The radiation source arrangement of claim 1, wherein the first radiation and the gaseous medium are confined in an elongate waveguide to promote their interaction, wherein the third radiation includes radiation escaping through a wall of the elongate waveguide.

12. The radiation source arrangement of claim 1, wherein:
the first photodetector is configured to detect a distribution of intensity of the third radiation in the vicinity of the gaseous medium, and
the processor is configured to determine the operating condition of the radiation source arrangement further based at least partly on the distribution of intensity.

13. The radiation source arrangement of claim 1, wherein:
the first and second photodetectors are configured to detect a distribution of phase and intensity, respectively, in the vicinity of the gaseous medium;
the processor is configured to determine the operating condition of the radiation source arrangement based further at least partly on the distribution of phase and intensity; and
the one or more optical elements are configured to cause interference between the third radiation and a reference beam, the reference beam comprising a portion of the condition sensing radiation that has not interacted with the gaseous medium.

14. The radiation source arrangement of claim 1, wherein:
the one or more optical elements are configured to discriminate two or more spectral components within the third radiation: and
the processor is configured to determine the operating condition of the radiation source arrangement based at least partly on a spectral distribution of phase and intensity.

15. The radiation source arrangement of claim 1, further comprising:
a controller configured to adjust at least one operating parameter of the radiation source arrangement automatically in response at least partly to the operating condition determined by the processor based on the third radiation, resulting in an adjusted operating parameter, and
wherein the adjusted operating parameter is an operating parameter of a beam delivery system of the first radiation and comprises at least one of a beam width, an axial focus position, a transverse focus position or a wavefront.

16. The radiation source arrangement of claim 15, wherein:
the adjusted operating parameter is a parameter of the gaseous medium,
the gaseous medium is a gas jet, and
the adjusted operating parameter is an operating parameter of a gas delivery system.

17. The radiation source arrangement of claim 1, wherein the third radiation includes a portion of the first radiation that is reflected by the gaseous medium.

18. The radiation source arrangement of claim 1, wherein the processor is further configured to monitor the operating condition of the radiation source arrangement in real-time.

19. The radiation source arrangement of claim 1, wherein the processor is further configured to detect a wear condition of a part of the radiation source arrangement based on the operating condition.

20. A method of monitoring an operating condition of a radiation source arrangement, the radiation source arrangement causing an interaction between a first radiation and a gaseous medium and thereby generating a second radiation by higher harmonic generation, the method comprising:
detecting a third radiation resulting from an interaction between a condition sensing radiation and the gaseous medium by at least one sensor comprising a first photodetector, a second photodetector, and one or more optical elements, the second radiation comprising radiation having a different wavelength than the third radiation, wherein the third radiation includes a portion of the condition sensing radiation that is scattered by the gaseous medium;
monitoring an operating condition of the radiation source arrangement based at least partly on the third radiation and results from the first and the second photodetectors.

21. A non-transitory computer program product comprising machine-readable instructions for causing a processor to implement the method of claim 20.

* * * * *